(12) United States Patent
Ooya et al.

(10) Patent No.: US 7,709,855 B2
(45) Date of Patent: May 4, 2010

(54) LIGHT-EMITTING DEVICE, BACKLIGHT USING SAME, AND LIQUID CRYSTAL DISPLAY

(75) Inventors: Yasumasa Ooya, Chigasaki (JP); Ryo Sakai, Yokohama (JP); Hajime Takeuchi, Yokohama (JP); Tsutomu Ishii, Yokohama (JP); Yasuhiro Shirakawa, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 257 days.

(21) Appl. No.: 12/064,519

(22) PCT Filed: Aug. 22, 2006

(86) PCT No.: PCT/JP2006/316400

§ 371 (c)(1),
(2), (4) Date: Feb. 22, 2008

(87) PCT Pub. No.: WO2007/023807

PCT Pub. Date: Mar. 1, 2007

(65) Prior Publication Data

US 2009/0097233 A1 Apr. 16, 2009

(30) Foreign Application Priority Data

Aug. 23, 2005 (JP) ............................... 2005-241692

(51) Int. Cl.
*H01L 33/00* (2006.01)
(52) U.S. Cl. ................. 257/99; 257/E33.025
(58) Field of Classification Search .......... 257/97–100, 257/79–80, 88, E33.025
See application file for complete search history.

(56) References Cited

U.S. PATENT DOCUMENTS

| | | | | |
|---|---|---|---|---|
| 7,495,322 B2 * | 2/2009 | Hashimoto et al. | .......... | 257/676 |
| 7,501,660 B2 * | 3/2009 | Schmid et al. | ................ | 257/81 |
| 7,518,155 B2 * | 4/2009 | Ishidu et al. | ................... | 257/98 |
| 7,547,923 B2 * | 6/2009 | Shin et al. | ...................... | 257/99 |
| 7,557,383 B2 * | 7/2009 | Obara et al. | ................... | 257/98 |
| 7,557,384 B2 * | 7/2009 | Matsumoto et al. | ........... | 257/99 |
| 7,566,912 B2 * | 7/2009 | Lee et al. | ....................... | 257/98 |
| 2004/0041165 A1 * | 3/2004 | Fukasawa et al. | .............. | 257/99 |
| 2004/0119086 A1 | 6/2004 | Yano et al. | | |
| 2004/0222433 A1 | 11/2004 | Mazzochette et al. | | |
| 2005/0139846 A1 * | 6/2005 | Park et al. | ....................... | 257/98 |
| 2005/0280019 A1 | 12/2005 | Konno | | |
| 2006/0006405 A1 * | 1/2006 | Mazzochette | ................. | 257/99 |
| 2006/0102917 A1 | 5/2006 | Oyama et al. | | |

FOREIGN PATENT DOCUMENTS

CN 1503382 A 6/2004

(Continued)

*Primary Examiner*—Nathan W Ha
(74) *Attorney, Agent, or Firm*—Oblon, Spivak, McClelland, Maier & Neustadt, L.L.P.

(57) ABSTRACT

A light-emitting device includes a semiconductor light-emitting element arranged on a substrate having internal wiring, a reflector arranged around the semiconductor light-emitting element, and a light-emitting portion, filled in the reflector, having a phosphor which emits visible light when excited by light from the semiconductor light-emitting element. Electrical conduction to the light-emitting element is obtained via the internal wiring of the substrate and the reflector.

15 Claims, 4 Drawing Sheets

FOREIGN PATENT DOCUMENTS

| | | |
|---|---|---|
| JP | 2001 203396 | 7/2001 |
| JP | 2001-210122 | 8/2001 |
| JP | 2002 198573 | 7/2002 |
| JP | 2002 232017 | 8/2002 |
| JP | 2003 160785 | 6/2003 |
| JP | 2004 193581 | 7/2004 |
| JP | 2004 359842 | 12/2004 |
| JP | 2005 223222 | 8/2005 |
| JP | 2006 012868 | 1/2006 |
| JP | 2006 134975 | 5/2006 |

* cited by examiner

LIGHT-EMITTING DEVICE, BACKLIGHT USING SAME, AND LIQUID CRYSTAL DISPLAY

TECHNICAL FIELD

The present invention relates to a light-emitting device, a backlight using it, and a liquid crystal display.

BACKGROUND ART

A light emitting diode (LED) is a semiconductor element converting electrical energy into light such as ultraviolet light, visible light or the like, and has advantages that it has a long life and high reliability, and when the LED is used as a light source, the time which exchanges lamps can be saved. A light-emitting device (LED lamp) having an LED element sealed with, for example, a transparent resin is used extensively as a component part for various types of displays such as portable communication devices, PC peripheral devices, office automation equipment, home electric appliances, signal equipment, various types of switches, backlight type display panels, and the like.

For example, the light-emitting device using the LED element has a structure that the LED element is fixed onto a substrate and each of electrodes of the LED element is electrically connected to terminal on the substrate via a conductive wire, respectively. In addition, a reflector for reflecting light irradiated from the LED element is disposed around the LED element. For example, a light-emitting layer having phosphor particles is filled in the reflector (see, for example, Reference 1).

The color tone of light emitted from the light-emitting device is not limited to the light emission wavelength of the LED element, and visible light ranging from blue to red can be obtained depending on usages by, for example, a phosphor dispersed into the light-emitting layer. Especially, a white light-emitting type light-emitting device is useful as a backlight for the liquid crystal display of portable communication devices and PCs (see, for example, Reference 2).

The conventional light-emitting device having the LED element and the reflector disposed on the substrate has a drawback that emission luminance tends to become low. In other words, since the conductive wires extended from the electrodes of the LED element are connected to the terminals on the substrate, the reflector cannot be approached enough to the periphery of the LED element. Therefore, there is a space enough for disposition of the conductive wires between the reflector and the LED element. Light irradiated from the LED element is diffused needlessly within the light-emitting layer before it reaches the reflector and not irradiated enough to the reflector, so that the emission luminance becomes low.

To avoid the lowering of the emission luminance, there is, for example, a method that the conductive wires extended from the LED element are connected to the terminals on the substrate, which are located outside of the reflector, and the space between the LED element and the reflector is decreased. But, since this method forms a connection point of the conductive wire outside of the reflector, the same portion cannot be used effectively for other usages. In addition, since the conductive wires must be disposed over the top of the reflector, the conductive wires become long, and the productivity and reliability of the light-emitting device are lowered.

Meanwhile, as a method that unnecessary diffusion of light within the light-emitting layer is suppressed while the distance between the LED element and the reflector is remained as it is, the amount of a phosphor contained in the light-emitting layer may be decreased. But, such a method causes further lowering of the emission luminance because the content of the phosphor is decreased.

| [Reference 1] | JP-A 2002-198573 (KOKAI) |
| [Reference 2] | JP-A 2003-160785 (KOKAI) |

SUMMARY OF THE INVENTION

According to an aspect of the present invention, there are provided a light-emitting device that emission luminance can be improved without degrading the productivity and reliability, a backlight using the light-emitting device, and a liquid crystal display.

A light-emitting device according to an aspect of the present invention includes: a substrate having internal wiring; a semiconductor light-emitting element arranged on the substrate; a reflector arranged around the semiconductor light-emitting element; and a light-emitting portion, filled in the reflector, including a phosphor which emits visible light when excited by light from the semiconductor light-emitting element, wherein electrical conduction to the semiconductor light-emitting element is obtained via the internal wiring of the substrate and the reflector.

A backlight according to another aspect of the present invention includes: a mounting substrate; and a light source, mounted on the mounting substrate, including the light-emitting device according to the aspect of the present invention. In the backlight according to the aspect of the present invention, the light source includes, for example, a plurality of the light-emitting devices which are arranged in a linear or matrix form on the mounting substrate. A liquid crystal display according to still another aspect of the present invention includes: the backlight according to the aspect of the present invention; and a liquid crystal display part which is arranged on a light emission surface side of the backlight.

EXPLANATION OF REFERENCE NUMERALS

1: Light-emitting device, 2: internal wiring (internal wiring for LED), 3: substrate, 4: semiconductor light-emitting element (LED element), 5: reflector, 6: conductive wire, 7: light-emitting portion, 9: reflecting surface, 10: light emission surface, 11: step portion, 12: internal wiring (internal wiring for reflector), 20: liquid crystal display, 22: backlight.

MODE FOR CARRYING OUT THE INVENTION

Figure 1:
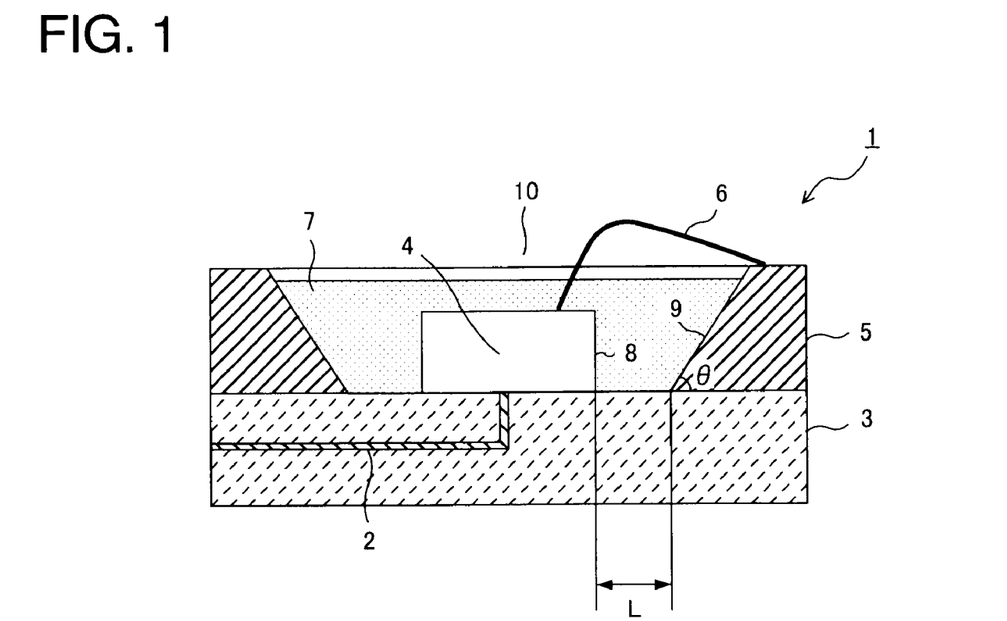
FIG. 1 is a sectional view showing a structure of a light-emitting device according to an embodiment of the present invention.

Modes of conducting the present invention will be described below. FIG. 1 is a sectional view showing a structure of the light-emitting device according to an embodiment of the present invention. A light-emitting device 1 shown in FIG. 1 is provided with a semiconductor light-emitting element 4 which is disposed on a substrate 3 having an internal wiring 2. As the semiconductor light-emitting element 4, an LED element (LED chip), a laser diode and the like can be applied. The LED element is used here as the semiconductor light-emitting element 4. A cylindrical reflector 5 having an inner wall surface inclined toward a light emission direction is disposed around the LED element 4.

One electrode (lower electrode (not shown)) of the LED element 4 is electrically connected to the internal wiring 2 of the substrate 3. The other electrode (upper electrode (not shown)) of the LED element 4 is electrically connected to the reflector 5 via a wire-bonded conductive wire 6. The reflector 5 is at least partly conductive. A light-emitting portion 7 containing a phosphor is filled into the reflector 5 to seal the LED element 4.

The light-emitting device 1 of this embodiment performs electrical conduction for feeding the LED element 4 through the internal wiring 2 of the substrate 3 and the reflector 5. Since it is not necessary to connect the conductive wire extended from the LED element to the terminal on the substrate like a conventional light-emitting device, a distance (L) between the LED element 4 and the reflector 5 can be decreased. As shown in FIG. 1, it is assumed that the distance (L) between the LED element 4 and the reflector 5 indicates a distance between an outer circumference portion 8 of the LED element 4 and the innermost part of a reflecting surface 9 of the reflector 5.

The distance (L) between the LED element 4 and the reflector 5 can be decreased to emit the light irradiated from the LED element 4 to the reflector 5 without diffusing needlessly within the light-emitting portion 7. Therefore, it becomes possible to enhance the emission luminance of the light-emitting device 1. And, by using the internal wiring 2 of the substrate 3 and the reflector 5 for electrical conduction to the LED element 4, a wire bonding portion can be determined to be only one portion between the LED element 4 and the reflector 5. It becomes unnecessary to perform wire bonding at plural portions, and it becomes possible to decrease the distance of the wire bonding in comparison with, for example, a case of connection to the exterior of the reflector 5. Therefore, the productivity and reliability of the light-emitting device 1 can be enhanced.

In addition, by connecting the conductive wire 6 extended from the LED element 4 to the reflector 5, it is not necessary to form on the exterior of the reflector 5 a connecting portion of the conductive wire 6, and the light-emitting device 1 can be formed to have substantially the same size as that of the reflector 5. Since it is not necessary to form the connecting portion of the conductive wire 6 on the exterior of the reflector 5, the connecting portion can be used effectively for other usages. For example, when the light-emitting device 1 is used to produce a backlight, a reflection sheet can be disposed at the connecting portion. When the light emitted from the light-emitting device 1 is reflected on an optical sheet or the like, the reflection sheet has a function to reflect again the light to the optical sheet side. Thus, the emission luminance of the backlight can be enhanced.

The light-emitting device 1 of this embodiment is desirable that the distance (L) between the LED element 4 and the reflector 5 is 1 mm or less. If the distance (L) between the LED element 4 and the reflector 5 exceeds 1 mm, the light irradiated from the LED element 4 is needlessly diffused within the light-emitting portion 7 and might not be irradiated sufficiently to the reflector 5. The emission luminance is degraded. Since the wire bonding distance between the LED element 4 and the reflector 5 also becomes long, there is a possibility that productivity and reliability are degraded. The distance (L) between the LED element 4 and the reflector 5 is more desirably 0.8 mm or less in view of the improvement of the emission luminance and productivity.

For example, the reflector 5 has a cylindrical shape with the reflecting surface 9 formed on the inner wall as shown in FIG. 1. The reflecting surface 9 of the reflector 5 is desirably inclined with respect to the surface of the substrate 3 to guide the light irradiated from the LED element 4 to a light emission surface 10. The reflecting surface 9 has desirably an inclined angle θ of 25° or more and 70° or less. If the inclined angle θ of the reflecting surface 9 is less than 25°, a reflection effect of the light irradiated from the LED element 4 is small, and there is a possibility that the emission luminance of the light-emitting device 1 cannot be enhanced sufficiently.

Meanwhile, if the inclined angle θ of the reflecting surface 9 exceeds 70°, the reflection effect is enhanced excessively to concentrate the light, and if the light-emitting device 1 is used as a light source for the backlight, there is a possibility that the uneven luminance is caused on the light emission surface of the backlight. The inclined angle θ of the reflecting surface 9 of the reflector 5 is preferably 30° or more and 60° or less, and more preferably 35° or more and 45° or less from viewpoints of improvement of emission luminance, suppression of uneven luminance when applied to the backlight, and the like.

Figure 2:
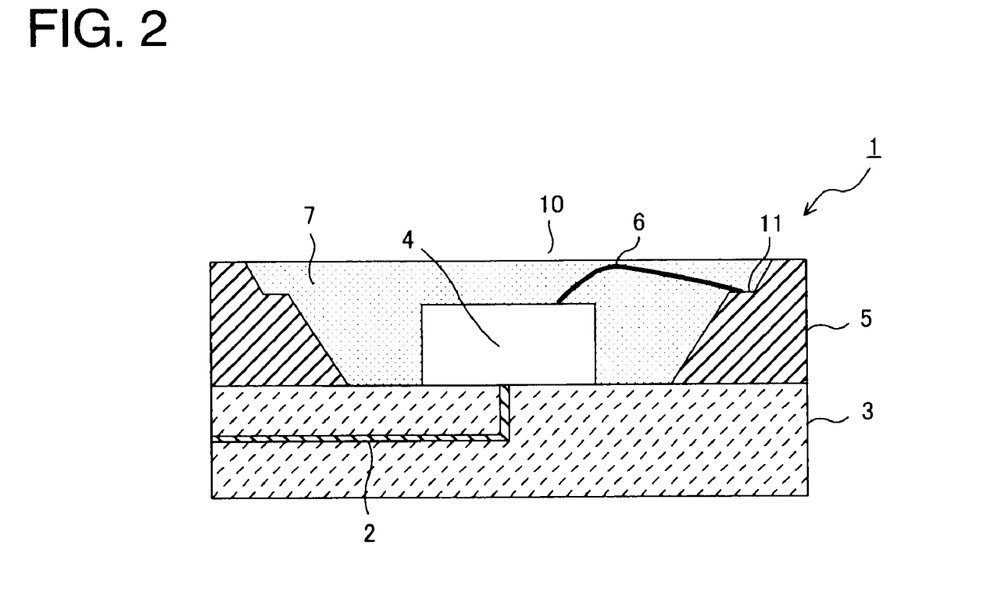
FIG. 2 is a sectional view showing a modified example of the light-emitting device shown in FIG. 1.

The top portion of the reflector 5 shown in FIG. 1 is evenly horizontal. The reflector 5 is not limited to the shown shape. For example, the reflector 5 may be formed with a lower step portion 11 at its upper inner part as shown in FIG. 2. In a case where the step portion 11 is formed at an upper part of the reflector 5, it is preferable that one end of the conductive wire 6 is connected to the step portion 11. Thus, the conductive wire 6 can be fully buried within the light-emitting portion 7.

The reflector 5 is at least partly formed of a conductive material because of necessity of securing electrical conduction with the LED element 4. The reflector 5 shown in FIG. 1 and FIG. 2 is entirely formed of a conductive material. As component materials for the reflector 5, it is desirable to use a metal material from viewpoints of electrical conductivity, light reflectivity and the like. Specifically, it is desirable that the reflector 5 is formed of a metal such as nickel, silver, copper or aluminum or an alloy of them.

Figure 3:
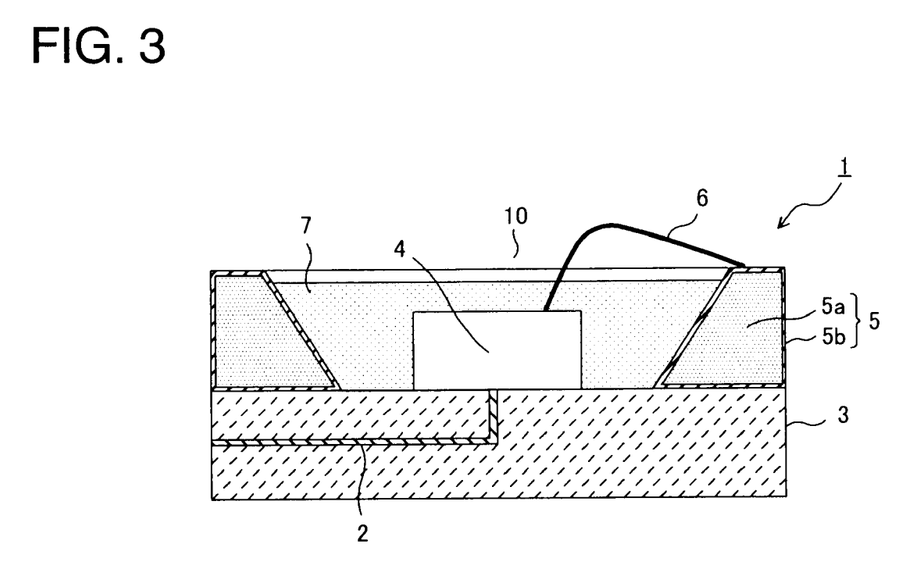
FIG. 3 is a sectional view showing another modified example of the light-emitting device shown in FIG. 1.
Figure 4:
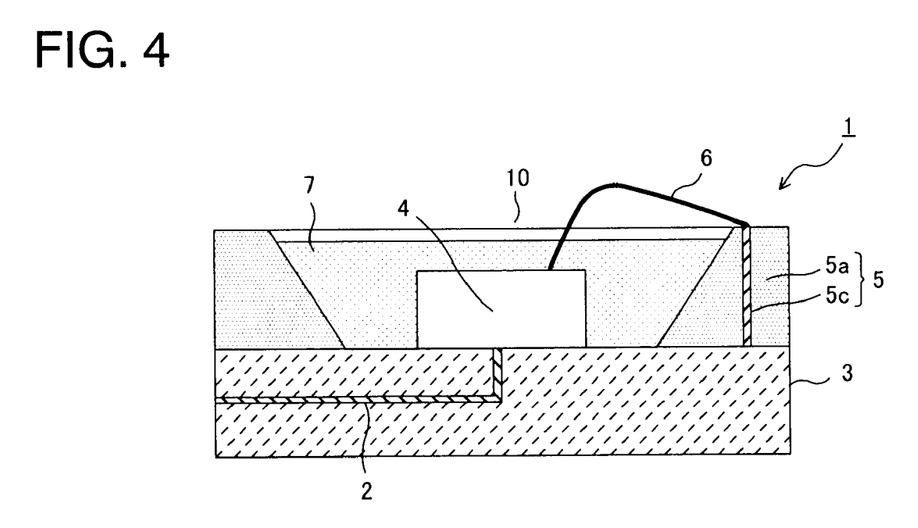
FIG. 4 is a sectional view showing still another modified example of the light-emitting device shown in FIG. 1.

As shown in FIG. 3, the reflector 5 may be formed by using an insulating material for a reflector body 5a which is a maim part and forming on its surface a coating 5b which is formed of a conductive material. The coating 5b is preferably formed of a metal material from viewpoints of electrical conductivity, light reflectivity and the like. As a forming material for the coating 5b, a metal such as nickel, silver, copper or aluminum or an alloy of them is used. The coating 5b formed of the metal material is formed by a known film formation method such as, for example, plating, deposition, sputtering or the like. As shown in FIG. 4, the reflector 5 may be formed by using an insulating material to form the reflector body 5a and disposing in it an internal wiring 5c formed of a conductive material.

Figure 5:
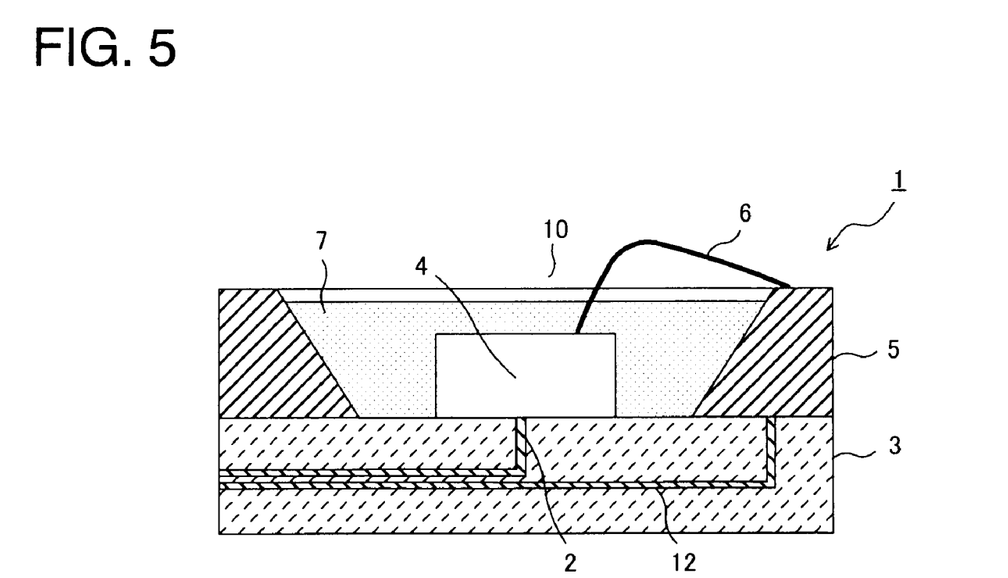
FIG. 5 is a sectional view showing still another modified example of the light-emitting device shown in FIG. 1.

The substrate 3 on which the LED element 4 is arranged has at least one internal wiring 2 for electrical conduction to the LED element 4 as shown in FIG. 1 and FIG. 2. As shown in FIG. 5, the substrate 3 may have an internal wiring (reflector internal wiring) 12 which is conducted to the reflector 5 in addition to the internal wiring (LED internal wiring) 2 for electrical conduction to the LED element 4. In this case, a lower part of the reflector 5 and the internal wiring 12 which is exposed to the surface of the substrate 3 are electrically connected.

Figure 6:
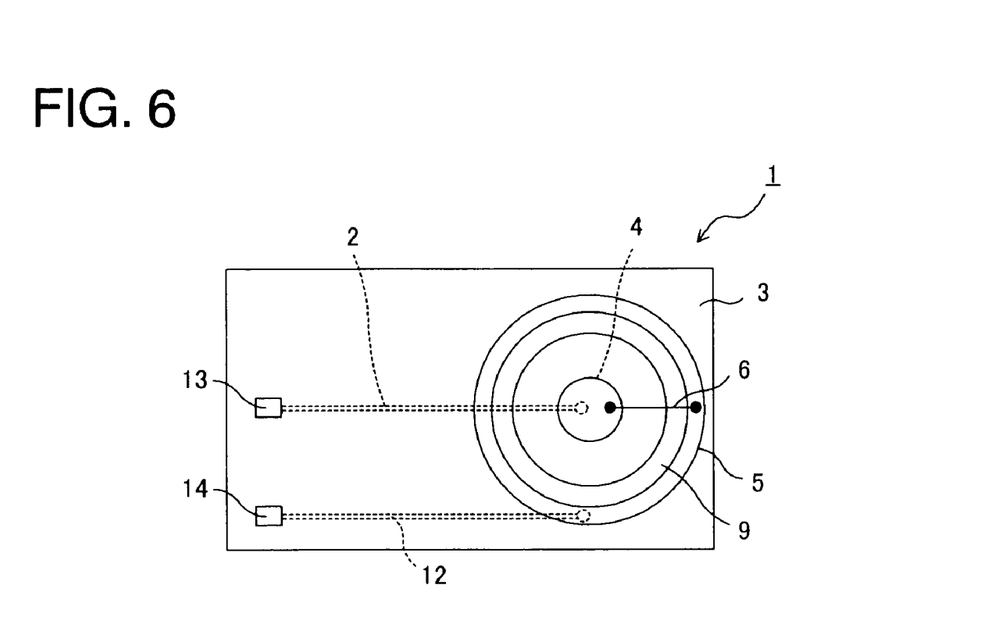
FIG. 6 is a diagram showing an example of a planar structure of the light-emitting device shown in FIG. 5.

In a case where two internal wirings 2, 12 are disposed in the substrate 3, one ends between both ends of the internal wirings 2, 12, which are not connected to the LED element 4 and the reflector 5, are extended to one end of the substrate 3 as shown in, for example, FIG. 6, and connected to external connection terminals 13, 14 which are formed on the front surface of the substrate 3. The external connection terminals 13, 14 may be formed on the rear surface of the substrate 3. For electrical conduction to the reflector 5, a conductive pattern formed on the substrate 3 may be used.

The substrate 3 is mainly formed of a ceramic material such as aluminum nitride (AlN), alumina ($Al_2O_3$) or silicon nitride ($Si_3N_4$) or an organic material such as a resin. Among them, the substrate 3 mainly formed of aluminum nitride having an excellent thermal conductivity is preferably used. Especially, it is desirable to use the substrate 3 which is mainly formed of aluminum nitride having a thermal conductivity of 200 W/m·K or more.

For the conductive wire 6 which electrically connects the LED element 4 and the reflector 5, a metal wire formed of a metal such as gold, platinum, copper or aluminum or an alloy of them is used. Especially, it is desirable to use the wire formed of gold or its alloy. By using the metal wire as the conductive wire 6, the LED element 4 and the reflector 5 can be electrically connected easily. The conductive wire 6 can be connected (bonded) directly to the electrode of the LED element 4 and the reflector 5 when a material which is readily alloyed is used. When a material which is hardly alloyed is used, bonding is made via a material which is alloyed.

As the LED element 4, there is preferably used one which emits, for example, ultraviolet light or purple-color light having a wavelength in a range of 360 nm to 440 nm. The LED element 4 includes one having, for example, a nitride-based compound semiconductor layer as the light-emitting layer. When the LED element 4 which emits ultraviolet light or purple-color light is used, the light-emitting portion 7 is desirably configured of a transparent resin in which a three-color phosphor which has blue, green and red phosphors mixed is contained. As the transparent resin, for example, acryl resin, silicone resin or epoxy resin is used.

The phosphor is excited by light (e.g., ultraviolet light or purple-color light) irradiated from the LED element 4 to emit visible light. When the LED element 4 which emits ultraviolet light or purple-color light is used in combination with the light-emitting portion 7 containing the three-color phosphor, the three-color phosphor is excited by the ultraviolet light or purple-color light irradiated from the LED element 4 to emit white light. It is desirable that the phosphor absorbs efficiently ultraviolet light or purple-color light having a wavelength in a range of 360 nm to 440 nm irradiated from the LED element 4. Thus, the light-emitting device 1 of a white light-emitting type can be configured. The light-emitting device 1 of this embodiment is desirably a white light-emitting type.

Examples of a blue light-emitting phosphor include an Eu-activated halophosphate phosphor, an Eu-activated aluminate phosphor and the like excelling in absorption efficiency of ultraviolet light and purple-color light. Examples of a green light-emitting phosphor include a Cu and Al-activated zinc sulfide phosphor, an Eu and Mn-activated aluminate phosphor and the like. Examples of a red light-emitting phosphor include an Eu-activated yttrium oxysulfide phosphor, an Eu and Sm-activated lanthanum oxysulfide phosphor, a Cu and Mn-activated zinc sulfide phosphor and the like. They are appropriately selected and used considering color rendering properties, uniformity of light emission, and luminance characteristics.

A phosphor content in the light-emitting portion 7 is desirably 20 wt % or more. As described above, the conventional light-emitting device suppresses the phosphor content to a low level in order to emit the light irradiated from the LED element to, for example, the reflector without needlessly diffusing within the light-emitting portion. But, when the phosphor content is decreased, essential emission luminance lowers. In this embodiment, even when the light-emitting portion 7 is determined to have a phosphor content of 20 wt % or more, the light irradiated from the LED element 4 can be irradiated to the reflector 5 without needlessly diffusing within the light-emitting portion 7 because the distance between the LED element 4 and the reflector 5 is narrowed. Therefore, the emission luminance of the light-emitting device 1 can be improved without lowering the productivity and reliability of the light-emitting device 1.

For example, the light-emitting device 1 of this embodiment is produced as follows. Production of the light-emitting device 1 shown in FIG. 1 is described as an example. First, the substrate 3 having the internal wiring 2 is prepared. At a portion of the substrate 3 where the internal wiring 2 is exposed, namely a surface portion where the LED element 4 is bonded, is formed, for example, an Au—Sn eutectic alloy layer as a bonding material for bonding the LED element 4. One of the electrodes of the LED element 4 is aligned to and disposed at the surface portion, and a heating treatment is performed to fix the LED element 4 to the substrate 3 and also to electrically connect one of the electrodes of the LED element 4 to the internal wiring 2 of the substrate 3.

As the bonding material, an Au—Si eutectic alloy, an SnPb solder or the like can be used other than the Au—Sn eutectic alloy. A conductive paste may be used instead of such a low melting point alloy. The conductive paste has conductive powder of silver, copper, carbon or the like dispersed into a thermosetting resin such as epoxy resin.

Then, the cylindrical reflector 5 is bonded onto the substrate 3, to which the LED element 4 is fixed, so to surround the LED element 4. The reflector 5 is bonded onto the substrate 3 in the same manner as that of the LED element 4. Subsequently, a wire bonding process is performed to electrically connect the other electrode of the LED element 4 and the reflector 5 by the conductive wire 6. A transparent resin containing a phosphor is dripped into the reflector 5 and cured to form the light-emitting portion 7. Thus, the target light-emitting device 1 is produced.

The above-described method of producing the light-emitting device 1 is one example, and the method of producing the light-emitting device 1 is not limited to the above. The method of producing the light-emitting device 1 can be modified appropriately without departing from the spirit of the invention. For example, the LED element 4 may be bonded after the reflector 5 is bonded onto the substrate 3. As the substrate 3, one having the internal wiring (reflector internal wiring) 12 or a conductive pattern for electrical conduction to the reflector 5 as described above may be used.

The light-emitting device 1 of this embodiment can be used as, for example, a lighting device for various usages. A typical example of use of the light-emitting device 1 includes a light source for a backlight of various types of displays represented by a liquid crystal display. When the light-emitting device 1 is used as the light source, the emission luminance of the backlight can be improved. The backlight is configured by applying plural light-emitting devices 1 as the light source and arranging them in a linear or matrix form. It is to be noted that the backlight using only one light-emitting device 1 is not excluded.

To configure the backlight, the plural light-emitting devices 1 are arranged and mounted as the light source in a linear or matrix form on a mounting substrate. A module structure is as follows. The backlight having the plural light-emitting devices 1 arranged linearly is used as a side light type backlight or the like. The backlight having the plural light-emitting devices 1 arranged in a matrix form is used as a directly-beneath type backlight or the like. The structure of the backlight applying the light-emitting device 1 is not limited to a particular one and may be a directly-beneath type or a side light type.

Figure 7:
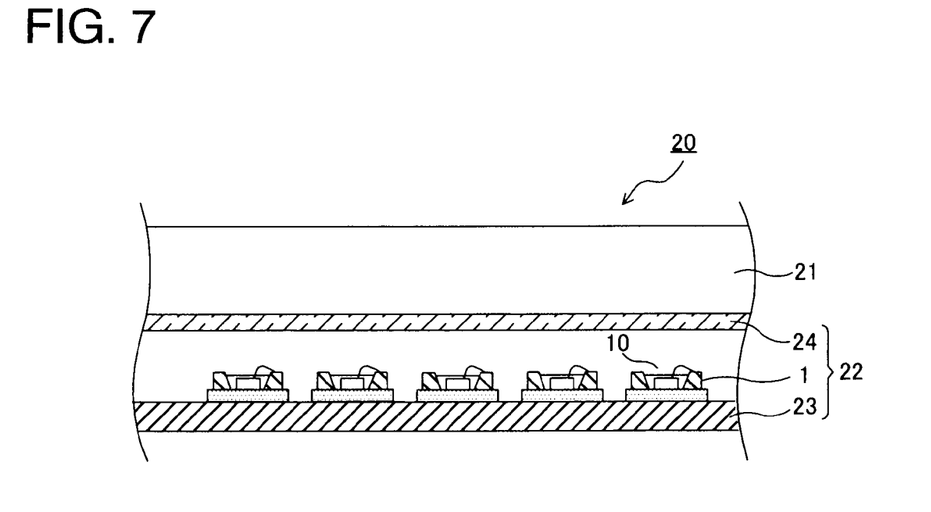
FIG. 7 is a sectional view showing a structure of a liquid crystal display according to an embodiment of the present invention.

The backlight of the embodiment described above is suitably used as the backlight for the liquid crystal display. FIG. 7 is a sectional view showing a structure example of a liquid crystal display 20 having a backlight applying the light-emitting device 1. The liquid crystal display 20 is provided with a flat liquid crystal panel 21 as, for example, a flat display means and a backlight 22 which illuminates the liquid crystal panel 21 from its back. The backlight 22 is arranged directly beneath the liquid crystal panel 21.

The liquid crystal panel 21 has an array substrate and a color filter substrate, which are glass plates having transparent electrodes formed thereon, disposed to face each other between two polarizing plates. Liquid crystal is filled between the array substrate and the color filter substrate to form a liquid crystal layer. Red (R), green (G) and blue (B) color filters are formed in correspondence with individual pixels on the color filter substrate.

The backlight 22 is provided with a mounting substrate (base substrate) 23 and the plural light-emitting devices 1 which are arranged and mounted in a matrix form on the mounting substrate 23. The specific module structure is as follows. The plural light-emitting devices 1 configure the light source of the backlight 22. The light-emitting devices 1 are arranged such that the non-light emission surfaces are positioned on the side of the mounting substrate 23. An optical sheet 24 such as a diffuser sheet, a prism sheet or the like is arranged on the side of the light emission surfaces 10 of the light-emitting devices 1. And, the backlight 22 is arranged directly beneath the liquid crystal panel 21 such that the optical sheet 24 is positioned on the side of the liquid crystal panel 21.

The liquid crystal display of the present invention is not limited to one using the directly-beneath type backlight but may apply a side-light type backlight. The side-light type backlight has, for example, a light source with the plural light-emitting devices 1 arranged linearly and a light guide plate. The light source is disposed at a light incident portion which is disposed at one end surface of the light guide plate. Light having entered through the light incident portion repeats refraction and reflection within the light guide plate and is irradiated from the top surface of the light guide plate in a direction of its normal line. The liquid crystal display section is arranged on the side of the top surface (light emission surface) of the light guide plate.

Specific examples of the invention and their evaluated results will be described below.

Examples 1 Through 5

In Examples 1 through 5, the light-emitting device 1 of a white light-emitting type shown in FIG. 1 was produced. First, an aluminum nitride substrate 3 (5 mm high×5 mm wide×0.5 mm thick) having the internal wiring 2 shown in FIG. 1 was prepared. On the surface of the aluminum nitride substrate 3, a portion (including the exposed part of the internal wiring 2) to which an ultraviolet LED element 4 was bonded was gold-plated, and the light-emitting diode (UV-LED element) 4 (0.3 mm long×0.3 mm wide×0.3 mm high) for emitting ultraviolet light was bonded to that surface portion.

A reflector 5 (1 mm high, reflecting surface angle (θ) 45°) formed of silver-plated oxygen-free copper was bonded onto the aluminum nitride substrate 3 to surround the UV-LED element 4. The reflector 5 was used in plural types such that its distance (L) to the UV-LED element 4 fell in a range of 0.6 to 1.4 mm (Examples 1 through 5). The UV-LED element 4 and the reflector 5 was electrically connected by a conductive wire 6, and a phosphor paste which had a mixture of a red phosphor, a green phosphor and a blue phosphor to be excited by ultraviolet rays dispersed into a transparent resin was filled in the reflector 5 and cured by heating to produce a white light-emitting device 1.

Comparative Example 1

Figure 8:
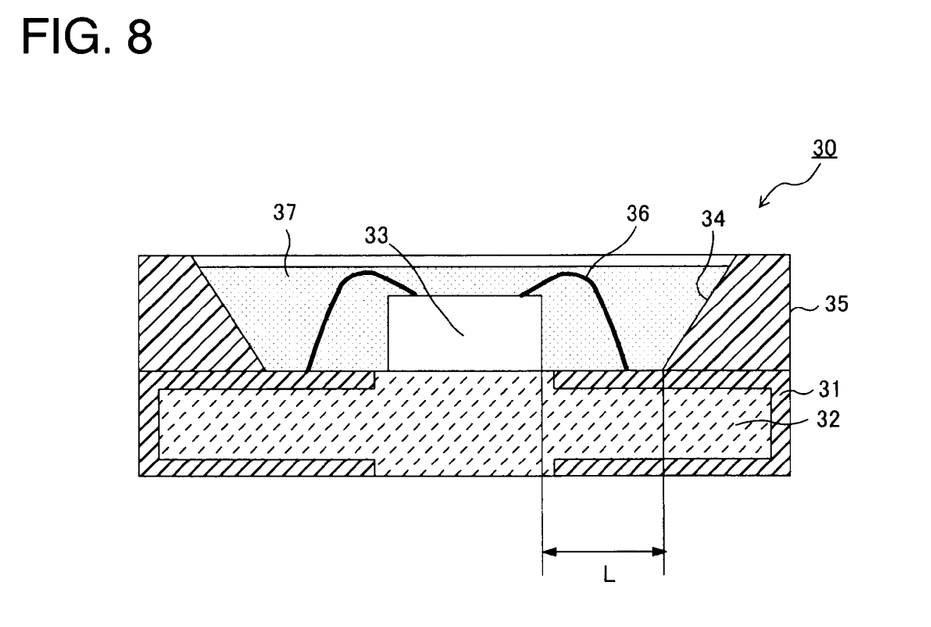
FIG. 8 is a sectional view showing a structure of a light-emitting device as a comparative example.

As a conventional white light-emitting device, a white light-emitting device 30 shown in FIG. 8 was produced. First, an aluminum nitride substrate 32 (5 mm long×5 mm wide×0.5 mm thick), on which terminal metal fittings 31 shown in FIG. 8 were disposed, was prepared. A UV-LED element 33 was bonded to a prescribed portion of the aluminum nitride substrate 32, and a reflector 35 (1 mm high, reflecting surface angle (θ) 45°) formed of silver-plated oxygen-free copper was bonded to a reflecting surface 34. Then, individual electrodes of the UV-LED element 33 and the individual terminal metal fittings 31 were electrically connected by conductive wires 36.

Subsequently, a phosphor paste which had a mixture of a red phosphor, a green phosphor and a blue phosphor to be excited by ultraviolet rays dispersed into a transparent resin was filled in the reflector 35 and cured by heating to produce the white light-emitting device 30. The white light-emitting device 30 was determined to have the distance (L) of 1.8 mm between the UV-LED element 33 and the reflector 35 in order to secure the connection points between the conductive wires 36 and the terminal metal fittings 31.

The above-described white light-emitting devices 1 of Examples 1 through 5 and the white light-emitting device 30 of Comparative Example 1 were measured for a total luminous flux (unit: lumen (lm)). The measured results are shown in Table 1.

TABLE 1

| | Distance (L) between light-emitting diode and reflector [mm] | Total luminous flux [lm] |
| --- | --- | --- |
| Example 1 | 0.6 | 1.4 |
| Example 2 | 0.8 | 1.3 |
| Example 3 | 1.0 | 1.2 |
| Example 4 | 1.2 | 0.8 |
| Example 5 | 1.4 | 0.6 |
| Comparative Example 1 | 1.8 | 0.5 |

It is apparent from Table 1 that the white light-emitting device 30 of Comparative Example 1 which has the conductive wires 36 arranged on the aluminum nitride substrate 32 between the UV-LED element 33 and the reflector 35 requires to secure the connection points between the conductive wires 36 and the terminal metal fittings 31, so that the distance (L) between the UV-LED element 33 and the reflector 35 becomes large. Therefore, it was confirmed that light emitted from the UV-LED element 33 tends to be diffused by the phosphor contained in a light-emitting portion 37 before it reaches the reflecting surface 34 of the reflector 35, and a total luminous flux becomes small as a result.

The light-emitting devices 1 of Examples 1 through 5 using the internal wiring 2 of the aluminum nitride substrate 3 as the electrical conduction to the UV-LED element 4 and the reflector 5 can decrease the distance (L) between the UV-LED element 4 and the reflector 5. Therefore, the light emitted from the UV-LED element 4 is suppressed from being diffused needlessly by the phosphor contained in the light-emitting portion 7 before it reaches the reflecting surface 9 of the reflector 5. Thus, it was confirmed that a total luminous flux was improved. Especially, it was confirmed that a total luminous flux was improved greatly when the distance (L) between the UV-LED element 4 and the reflector 5 was determined to be 1 mm or less.

Examples 6 Through 10

The white light-emitting device 1 (the distance (L) between the UV-LED element 4 and the reflector 5=0.8 mm) of Example 2 was used in quantity of 100 with an angle (θ) of the reflecting surface 9 of the reflector 5 varied in a range of 10° to 70° as shown in Table 2 to produce directly-beneath type backlights. The directly-beneath type backlights were evaluated for the presence or not of uneven luminance and emission luminance. The obtained results are shown in Table 2. The directly-beneath type backlights each were produced with the 100 white light-emitting devices uniformly arranged in a 10×10 matrix form.

The uneven luminance was visually observed on the light emission surfaces of the directly-beneath type backlights and evaluated depending on a degree of appearance that the light of the white light-emitting device 1 was seen as a dot. In Table 2, "A" indicates that no part was seen as a dot, "B" indicates that some parts were seen as a dot, and "C" indicates that many parts were seen as a dot. For the emission luminance, the light emission surfaces of the directly-beneath type backlights were visually observed. And, "A" indicates that the emission luminance of the directly-beneath type backlight is sufficient, and "B" indicates that the emission luminance is somewhat insufficient.

TABLE 2

|  | Angle [θ] of reflecting surface of reflector | Presence of uneven luminance | Emission luminance |
| --- | --- | --- | --- |
| Example 6 | 70° | C | A |
| Example 7 | 60° | B | A |
| Example 8 | 45° | A | A |
| Example 9 | 35° | A | A |
| Example 10 | 10° | A | B |

It is apparent from Table 2 that when the angle (θ) of the reflecting surface 9 of the reflector 5 is determined to be 35° or more and 45° or less, uneven luminance of the directly-beneath type backlight can be suppressed, and the emission luminance can be made sufficient. It is seen that the white light-emitting device 1 used for the directly-beneath type backlight is desired to have the angle (θ) of the reflecting surface 9 of the reflector 5 determined to be 35° or more and 45° or less from viewpoints of the suppression of the uneven luminance and the improvement of the emission luminance.

Examples 11 Through 15

The white light-emitting device 1 (the distance (L) between the UV-LED element 4 and the reflector 5=0.8 mm) of Example 2 was used in quantity of 10 with the angle (θ) of the reflecting surface 9 of the reflector 5 varied in a range of 10° to 70° as shown in Table 3 to produce side light type backlights. The side light type backlights were evaluated for the presence or not of the uneven luminance and the emission luminance. The obtained results are shown in Table 3. The uneven luminance and the emission luminance were evaluated in the same manner as in Examples 6 through 10. The side light type backlights each were produced with the ten white light-emitting devices uniformly arranged at equal intervals.

TABLE 3

|  | Angle [θ] of reflecting surface of reflector | Presence of uneven luminance | Emission luminance |
| --- | --- | --- | --- |
| Example 11 | 70° | A | A |
| Example 12 | 60° | A | A |
| Example 13 | 45° | A | A |
| Example 14 | 35° | A | A |
| Example 15 | 10° | A | B |

It is apparent from Table 3 that the side light type backlight has no occurrence of uneven luminance regardless of the angle (θ) of the reflecting surface 9 of the reflector 5 of the white light-emitting device 1. Since the side light type backlight uses the light guide plate, the occurrence of uneven luminance is suppressed regardless of the angle (θ) of the reflecting surface 9 of the reflector 5 of the white light-emitting device 1. It was confirmed that when the angle (θ) of the reflecting surface 9 of the reflector 5 was determined to be less than 35°, the emission luminance was degraded. It is seen that the white light-emitting device 1 used for the side light type backlight is desired to have the angle (θ) of the reflecting surface 9 of the reflector 5 determined to be 35° or more.

It is seen from the above-described results of Examples 6 through 10 and Examples 11 through 15 that in order to realize the white light-emitting device 1 that can suppress the uneven luminance and improve the emission luminance, namely the white light-emitting device 1 excelling in general-purpose properties regardless of use of either the directly-beneath type backlight or the side light type backlight, the angle (θ) of the reflecting surface 9 of the reflector 5 is determined to be 30° or more and 60° or less, and preferably 35° or more and 45° or less.

INDUSTRIAL APPLICABILITY

The light-emitting device according to the embodiment of the present invention can irradiate light, which is emitted from the semiconductor light-emitting element, to the reflector without diffusing needlessly within the light-emitting portion, so that excellent emission luminance can be obtained. In addition, by decreasing the wire bonding distance and number, the productivity and reliability of the light-emitting device can be enhanced. Such a light-emitting device is effectively used for various lighting usages such as a backlight.

What is claimed is:

1. A light-emitting device, comprising:
a substrate having internal wiring;
a semiconductor light-emitting element arranged on the substrate;
a reflector arranged around the semiconductor light-emitting element; and
a light-emitting portion, filled in the reflector, including a phosphor which emits visible light when excited by light from the semiconductor light-emitting element,
wherein electrical conduction to the semiconductor light-emitting element is obtained via the internal wiring of the substrate and the reflector.

2. The light-emitting device according to claim 1, wherein the reflector is formed of a conductive metal material.

3. The light-emitting device according to claim 1, wherein the reflector has a coating formed of a conductive metal material formed on its surface.

4. The light-emitting device according to claim 1, wherein one of electrodes of the semiconductor light-emitting element is electrically connected to the internal wiring of the substrate, and the other electrode is electrically connected to the reflector via a conductive wire.

5. The light-emitting device according to claim 4, wherein the conductive wire is bonded to the reflector at one point.

6. The light-emitting device according to claim 1, wherein a distance between the semiconductor light-emitting element and the reflector is 1 mm or less.

7. The light-emitting device according to claim 1, wherein a reflecting surface of the reflector is inclined in a range of 25° or more and 70° or less to a surface of the substrate.

8. The light-emitting device according to claim 1, wherein the light-emitting portion emits white light.

9. The light-emitting device according to claim 1, wherein the light-emitting portion includes as the phosphor a mixture of a blue light-emitting phosphor, a green light-emitting phosphor and a red light-emitting phosphor, and a transparent resin containing the phosphor mixture.

10. The light-emitting device according to claim 1, wherein the semiconductor light-emitting element is provided with a light-emitting diode or a laser diode.

11. A backlight, comprising:
a mounting substrate; and
a light source, mounted on the mounting substrate, including the light-emitting device according to claim 1.

12. The backlight according to claim 11, wherein the light source includes a plurality of the light-emitting devices which are arranged in a linear or matrix form on the mounting substrate.

13. A liquid crystal display, comprising:
the backlight according to claim 12; and
a liquid crystal display part which is arranged on a light emission surface side of the backlight.

14. The liquid crystal display according to claim 13, wherein the backlight includes the plurality of the light-emitting devices which are arranged in the matrix form, and is arranged directly beneath the liquid crystal display part.

15. The liquid crystal display according to claim 13, wherein the liquid crystal display part is arranged on a light guide plate, and the backlight includes the plurality of the light-emitting devices which are arranged in a linear form, and is disposed at one end of the light guide plate.

* * * * *